(12) United States Patent
Lerner

(10) Patent No.: US 11,916,104 B2
(45) Date of Patent: Feb. 27, 2024

(54) TRENCH INSULATION STRUCTURE WITH ENLARGED ELECTRICALLY CONDUCTIVE SIDE WALL

(71) Applicant: X-FAB Semiconductor Foundries GmbH, Erfurt (DE)

(72) Inventor: Ralf Lerner, Erfurt (DE)

(73) Assignee: X-FAB Semiconductor Foundries GmbH, Erfurt (DE)

( * ) Notice: Subject to any disclaimer, the term of this patent is extended or adjusted under 35 U.S.C. 154(b) by 0 days.

(21) Appl. No.: 17/804,881

(22) Filed: Jun. 1, 2022

(65) Prior Publication Data
US 2022/0293728 A1 Sep. 15, 2022

Related U.S. Application Data

(62) Division of application No. 16/858,095, filed on Apr. 24, 2020, now Pat. No. 11,355,582.

(30) Foreign Application Priority Data

Apr. 26, 2019 (DE) ...................... 10 2019 110 922.1

(51) Int. Cl.
*H01L 29/06* (2006.01)
*H01L 21/762* (2006.01)
*H01L 23/522* (2006.01)

(52) U.S. Cl.
CPC .... *H01L 29/0649* (2013.01); *H01L 21/76237* (2013.01); *H01L 21/76224* (2013.01); *H01L 23/5225* (2013.01)

(58) Field of Classification Search
CPC ............ H01L 29/0649; H01L 21/7637; H01L 21/76224; H01L 21/5225; H01L 21/761; H01L 27/7463
USPC ......................... 438/306, 361; 257/508, 510
See application file for complete search history.

(56) References Cited

U.S. PATENT DOCUMENTS

| | | |
|---|---|---|
| 4,676,847 A | 6/1987 | Lin |
| 5,013,673 A | 5/1991 | Fuse |
| 5,047,359 A | 9/1991 | Nagatomo |
| 5,283,461 A | 2/1994 | Beasom |
| 5,734,192 A | 3/1998 | Sengle |
| 6,394,638 B1 | 5/2002 | Sengle |
| 6,509,240 B2 | 1/2003 | Ren et al. |

(Continued)

*Primary Examiner* — Thinh T Nguyen
(74) *Attorney, Agent, or Firm* — GREENBERG TRAURIG LLP

(57) ABSTRACT

A semiconductor device may include a first active component region (20) and a second active region (22) extending flat along a first lateral direction ($L_1$) and a second lateral direction ($L_2$) deviating from said first lateral direction. The semiconductor device may include a trench isolation structure (10, 10') that electrically isolates the first active component region (20) from the second active region (22) along the first lateral direction ($L_1$) and comprises at least one electrically conductive sidewall (14, 14', 14"); said trench isolation structure (10) having a continuously extending insulating trench isolation base wall (30) and a plurality of spaced apart trench isolation portions (32a, 32b) with electrically conductive sidewall portions (14a, 14b) therebetween. The plurality of trench isolation portions (32a, 32b) and the electrically conductive sidewall portions (14a, 14b) are spaced (a, b) from the base wall (30).

9 Claims, 8 Drawing Sheets

(56) References Cited

U.S. PATENT DOCUMENTS

| | | |
|---|---|---|
| 9,385,190 B2 | 7/2016 | Pigott et al. |
| 2002/0020874 A1 | 2/2002 | Gimonet |
| 2015/0130016 A1* | 5/2015 | Kao .................... H01L 27/1463 |

* cited by examiner

FIG. 3a (Section Q31)
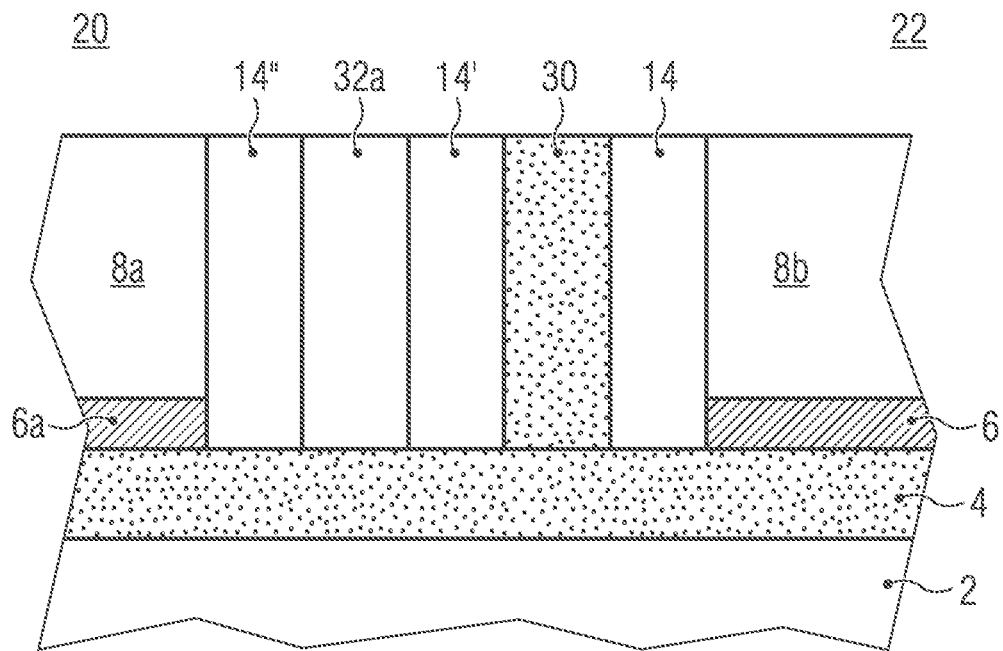
FIG. 3b (Section Q32)
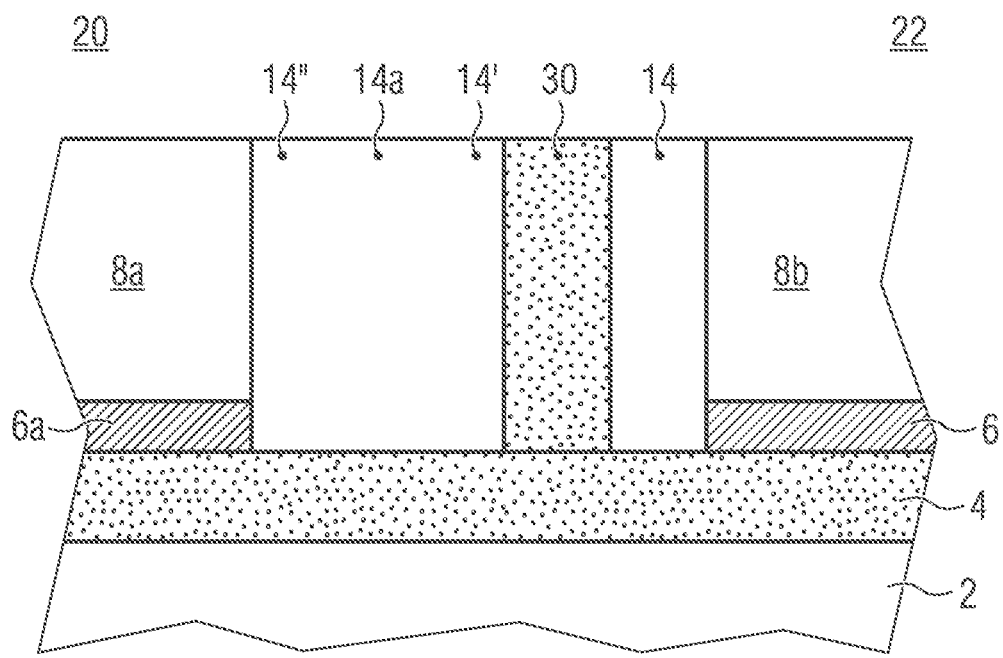

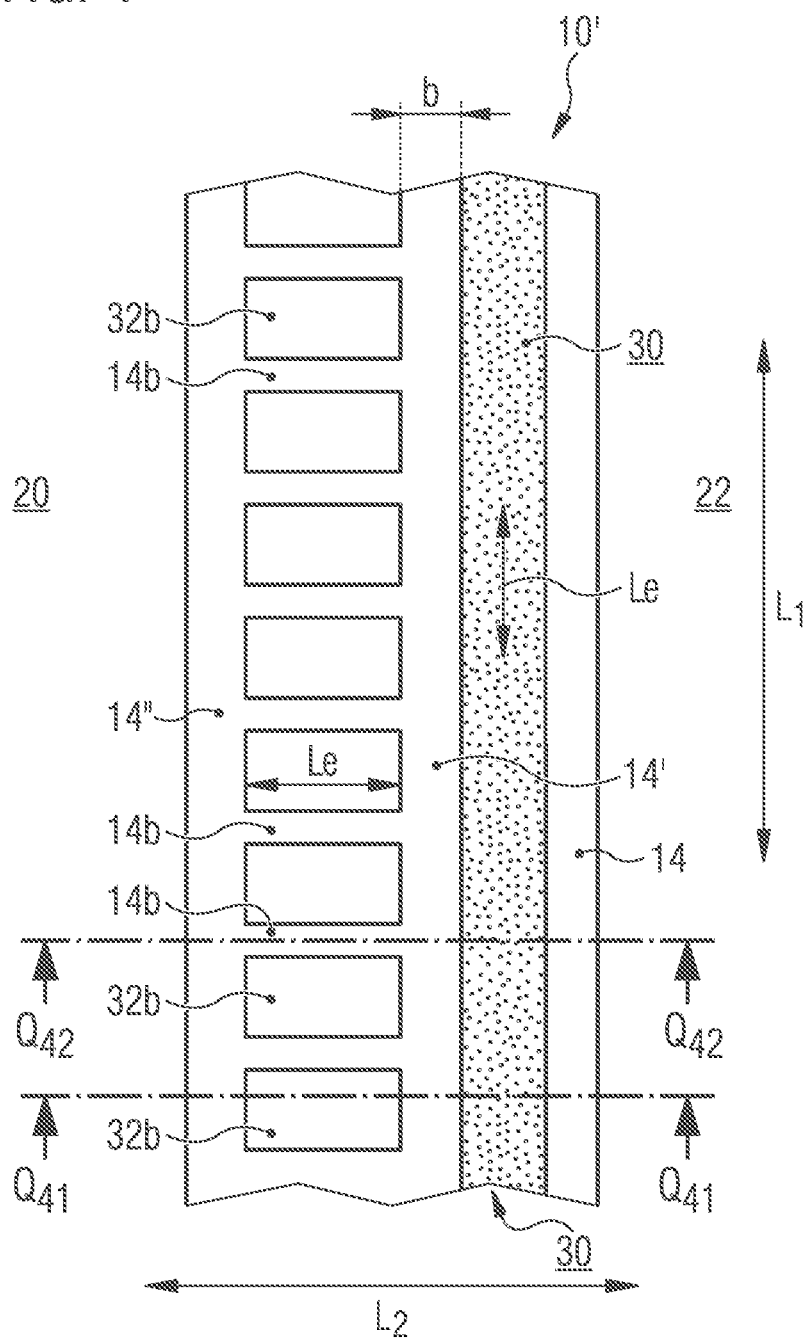

FIG. 4a (Section Q41)
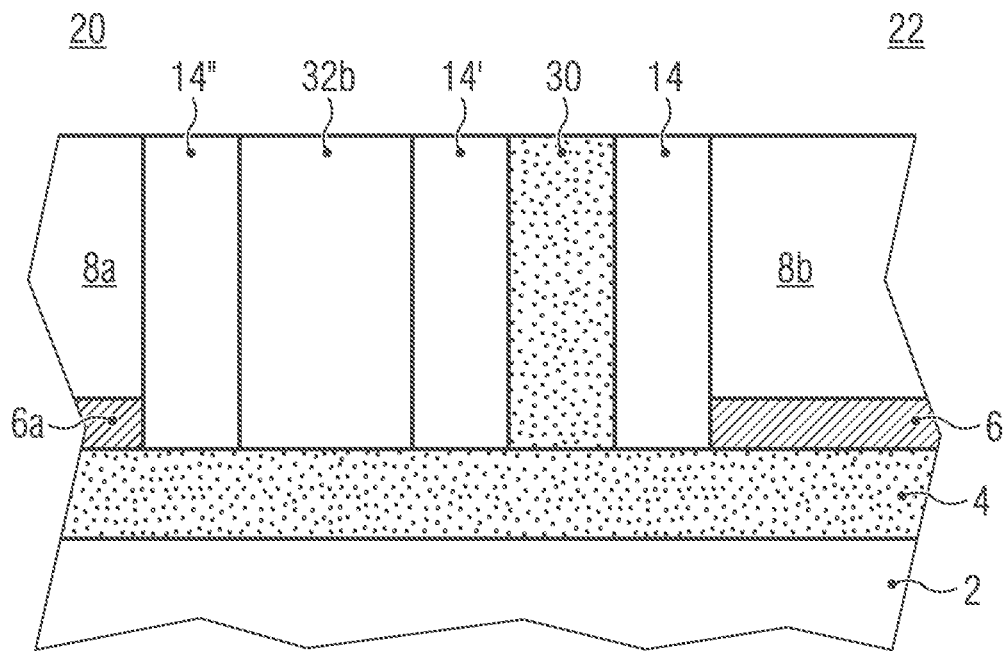
FIG. 4b (Section Q42)
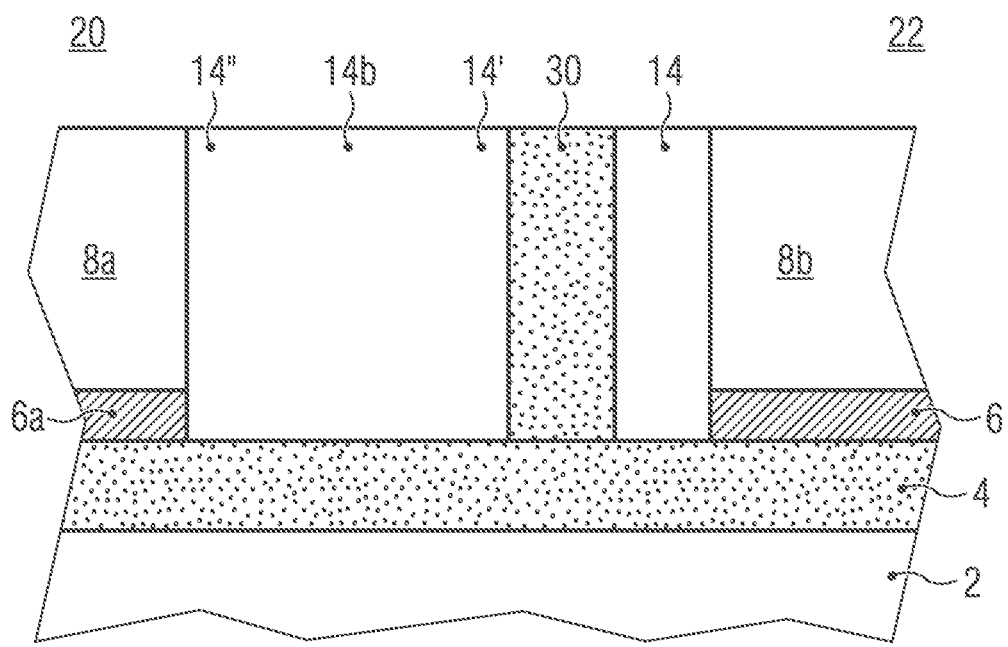

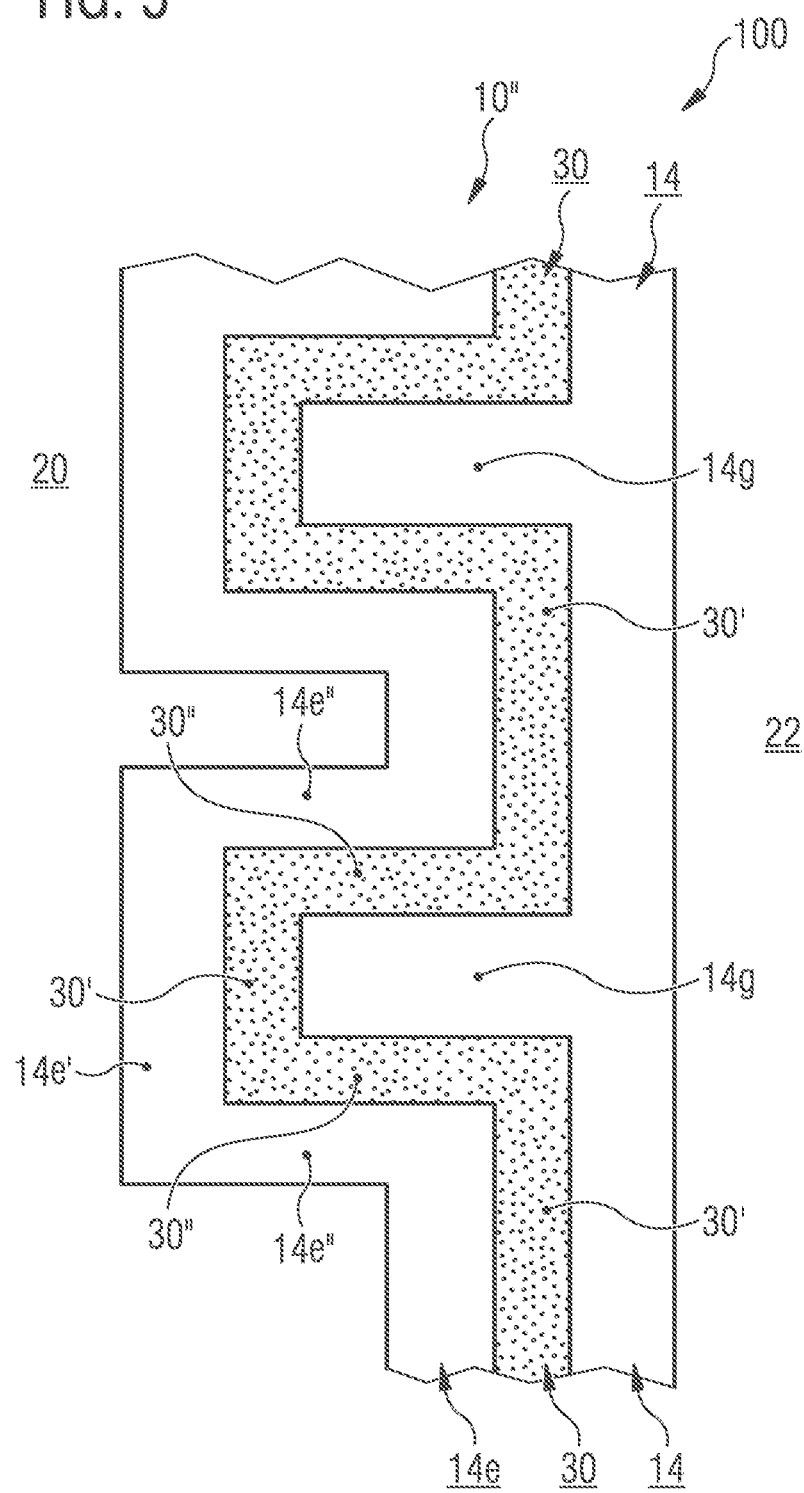

TRENCH INSULATION STRUCTURE WITH ENLARGED ELECTRICALLY CONDUCTIVE SIDE WALL

This application is a Divisional of U.S. patent application Ser. No. 16/858,095, filed Apr. 24, 2020, now U.S. Pat. No. 11,355,582, which claims priority to German Patent Application No. 10 2019 110 922.1, filed Apr. 26, 2019, the disclosures of which are hereby incorporated, by reference, in their entireties.

This disclosure (and claims) generally relate to isolation trenches in semiconductor devices with electrically conductive sidewalls that have an additional function, for example, providing electrical conductivity.

Semiconductor devices are fabricated on suitable substrates, e.g. semiconductor wafers and such like, wherein corresponding layers and layer sequences are produced that are suitably structured in the lateral direction so that a desired function is achieved. In this way, highly complex components, for example, transistors, resistors, capacitors and such like, are formed. The corresponding functional layers are produced not only on the carrier material, e.g. by deposition, but rather such layers are also produced in the carrier material itself, for example, by introducing suitable doping substances in order to produce regions that are suitably electrically adjusted.

Frequently, it is necessary to electrically separate component regions laterally as well as in depth from each other. For this purpose, isolations structures in the form of trenches are often used which are also referred to as trench isolations structures in the following. The corresponding trench isolation structures are usually produced in such a way that initially a trench is produced in the carrier material or semiconductor material by etching to a depth that is suitable for the corresponding purpose. For example, the designs or the layout of corresponding trenches are provided in such a manner that a certain component region is enclosed and thus electrically separated from other component regions, wherein one or more components can be provided inside of the enclosed structure and a further component region in the form of a closed area is provided outside of the enclosed structure, or an empty region is maintained in which no semiconductor components are fabricated or will be fabricated.

The trenches are typically produced as structures with straight-line portions strung together in the lateral directions in such a manner that the desired lateral enclosure of component regions and thus the (lateral) electrical isolation thereof is obtained after the trenches are filled, at least in part, with a suitable insulating material.

Figure 1:
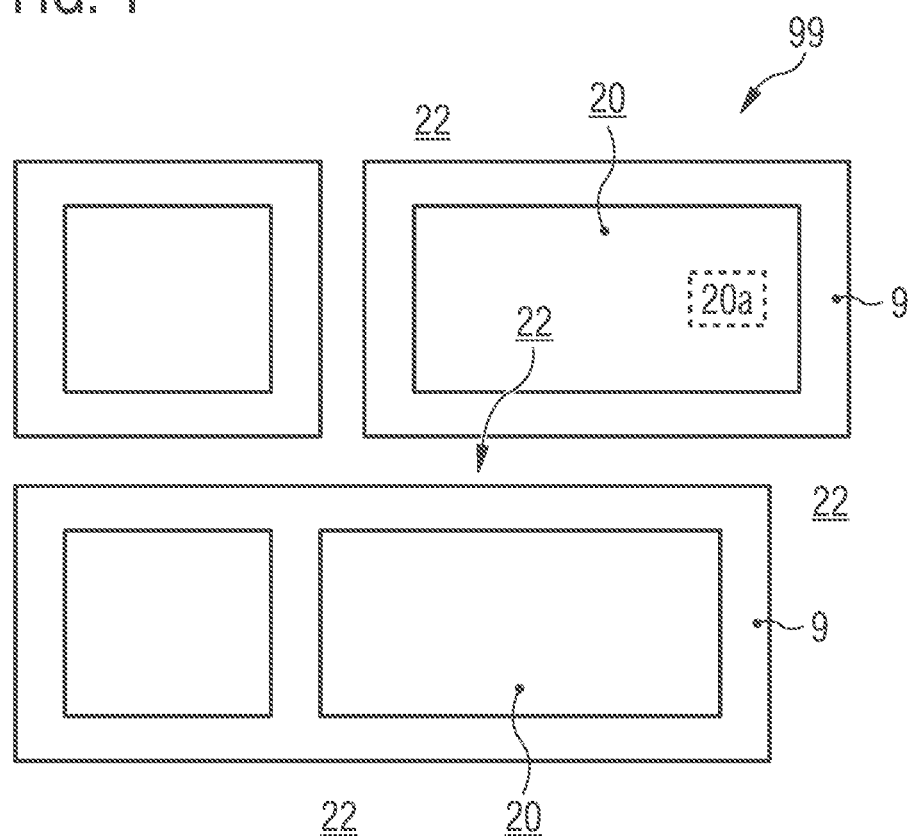

FIG. 1 schematically shows a top view or a layout of a semiconductor device 99 wherein first component regions 20, in which e.g. semiconductor components in the form of transistors 20a, resistors or such like are provided, are to be electrically separated from one or more other active regions 22. This is performed on the basis of trench isolations structures 9 that are composed of straight-line portions extending in the respective lateral directions so that typically a rectangular form or the form of a polygon is obtained in the case of an annular enclosure of the corresponding enclosed component region 20.

In the direction of depth (in the direction perpendicular to the drawing plane of FIG. 1), the corresponding isolation trench 9 extends up to a depth as is necessary for the given semiconductor device 99. Many devices are fabricated, for example, on the basis of an SOI architecture in which a buried insulating layer is provided that enables a reliable electrical isolation in the depth of the semiconductor device. Thus, the isolation trenches often extend up to this buried insulating layer or therethrough so that the corresponding component regions 20 represent substantially completely electrically isolated regions. They are defined laterally and in depth by an insulating material.

In recent developments, the trench isolation structures are to accomplish further functions other than electrical isolation of adjacent regions. For example, isolation trenches with conductive sidewalls are provided that are intended to provide an electrical connection having a resistance as low as possible to underlying component layers depending on the application. Such applications include, for example, trench-isolated Smart Power Technology in an SOI architecture on silicon wafers wherein the isolation trench functions as an isolation element on the one hand, as described above, and as an electrical connection to a buried doped region on the other hand. For example, a heavily n-doped sidewall of an isolation trench would lend itself as a suitable connection to a buried n-doped layer so that electrical connection is enabled on the one hand, and large-area connection structures to the buried doped layer can be avoided on the other hand, which connection structures would have to be produced using additional complex process steps.

In other examples, isolation trenches with a well conductive sidewall doping can also be used in p-n-isolated processes, for example, to connect doped buried layers.

Isolation trenches in SOI silicon wafers are often used to isolate various components, e.g. transistors, or entire regions having different potentials from each other in integrated Smart Power circuits.

Figure 2:
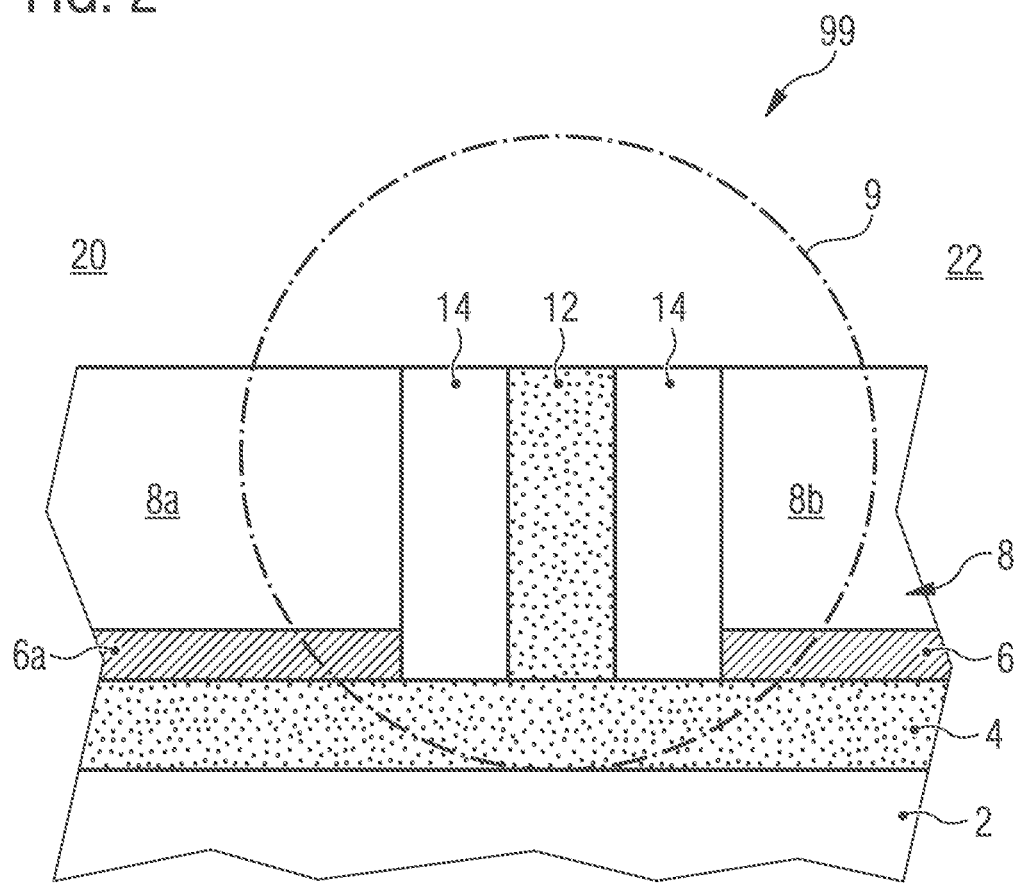

FIG. 2 shows a sectional view of a schematic isolation trench structure having a double function, i.e. the function of electrical isolation, and simultaneously the function of connection to buried conductive layers. As shown herein, the semiconductor device 99, which is illustrated e.g. in FIG. 1 in a top view, comprises a carrier material, e.g. in the form of a silicon wafer 2, with a buried insulating layer 4 applied thereto when considering, for example, an SOI architecture. The buried insulating layer 4 can be made of, for example, silicon oxide, silicon nitride or such like. In the illustrated example, the isolation trench structure 9 is to separate two active regions 20, 22 from each other in terms of potential, in which regions components, e.g. transistors and such like, are produced or are to be produced. The isolation trench structure 9 comprises an insulating material as an isolation wall 12, for example, in the form of silicon dioxide or such like, and has electrically conductive sidewalls 14 formed of a doped semiconductor material.

The doped sidewalls 14 provide the possibility to electrically connect corresponding buried layers 6, 6a formed in the respective component region 20 or 22 so that a well conductive connection to the respective buried layer 6 or 6a is established via the left and right sidewalls 14. Thus, an electrical connection having a relatively low resistance through an active material 8 (or layers 8a, 8b) can be realized without having to provide specific vias. On the other hand, the insulating material of the isolation trench 12 ensures that the two regions 20 and 22, i.e. in particular, the respective active materials 8a or 8b, and the respective buried conductive layers 6a, 6b are electrically separated from each other.

As shown, for example, in FIG. 1, the isolation trench structure 9 can enclose the component to be isolated or the region to be isolated, e.g. region 20. For example, in the form of a rectangle or ring-like when the entire isolation trench 12 has the shape of a polygon.

Such an application of isolation trenches is described, for example, in U.S. Pat. Nos. 5,734,192 A, 6,394,638 B1, and 9,385,190 B2. U.S. Pat. No. 5,283,461 also describes a trench structure by which the components to be isolated are separated from each other by a grid of isolation trenches.

In order to achieve a double use of the isolation trench, as explained by FIG. 2, the sidewalls of the isolation trench are doped, for example, by depositing a doped layer and subjecting the component to an annealing process so that doping atoms can diffuse from the doped layer into the trench sidewalls and thereby create conductive sidewalls. Such a technique is described, for example, in U.S. Pat. No. 4,676,847.

Other strategies for doping the sidewalls comprise ion implantation at specially set angles so that all trench sidewalls are suitably enriched with dopant. Such techniques are described, for example, in U.S. Pat. Nos. 5,013,673, 5,047,359, and 6,509,240.

The resistance and thus the conductivity of the sidewall including the doping is, inter alia, determined by the penetration depth of the doping into the semiconductor material of the sidewall, often a silicon material, and by the concentration of the dopant atoms, i.e. by the integral of the concentration from the trench sidewall to the junction formed by the doping in the carrier material. A reduction in resistance and thus an increase in conductivity of the sidewalls can thus typically be procedurally achieved only by increasing the concentration of the doping and/or by introducing the dopant atoms up to a greater depth in the carrier material.

However, there are procedural limitations for both the penetration depth of the dopant atoms and the concentration of the doping so that the reduction in resistance of the sidewall doping is limited. For example, the penetration depth is determined by the temperature-time budget of the subsequent process steps to be performed in the fabrication of semiconductor components, which temperature-time budged is defined by the entire process, so that the corresponding temperature treatment for the diffusion of the dopant atoms can be performed only in accordance with the predetermined temperature-time budget. Thus, the temperature and/or the time period of exposure to the increased temperature cannot be selected in accordance with the requirements for maintaining a high doping concentration and/or a deeply penetrated doping, but rather the specifications for these parameters must be considered with respect to the entire course of the process. Depending on the method of doping, the introduced concentration of dopants also has its limitations since, in an implantation process, for example, the angle of implantation and the maximum possible implantation dose are subject to limitations.

In view of the above-mentioned situation, it is thus an object of the invention to achieve a higher degree of flexibility in the provision of suitable conductive sidewalls, especially when sidewalls that are, at least in part, electrically conductive are to be provided in an isolation trench.

According to the invention, this problem is solved by providing a corresponding design or a layout of trench isolation structures whereby an enlarged total volume for conductive material is available.

The claimed semiconductor device comprises two active component regions that are isolated from each other. The isolation is performed along a first direction. The component regions extend flat along two directions referred to as lateral directions. The isolation is accomplished by a trench isolation structure (also referred to as isolation trench structure). This trench structure comprises at least one insulating trench isolation base wall, said base wall extending continuously. In addition, at least one electrically conductive sidewall is provided. As far as walls are concerned, they have a continuous extension. Trench isolation portions and electrically conductive sidewall portions are provided in addition to the present walls.

The structure of said portions, which can, for example, be alternately insulating and electrically conductive, realizes a heterogeneous wall that is, in part, insulating and, in part, electrically conductive.

The corresponding enlargement of the sidewall and thus of the available volume of conductive material in the trench isolation structure is accomplished by providing additional isolation trench portions that may serve the purpose of lateral isolation or not, but in any case enlarge the conventional design and thus lead to a layout that results in an increase in conductive material, e.g. composed of a doped semiconductor material, or including a metal-containing material, due to a larger sidewall and an increase in volume when put into practice.

In a first advantageous embodiment, a semiconductor device is provided in which a trench isolation structure separates a first active component region from a second active region. The trench isolation structure comprises a plurality of trench isolation portions (or isolation trench portions) with electrically conductive sidewall portions therebetween that extend along the first of the lateral directions, i.e. in parallel with the base wall.

The distinction between the concepts lies in the portions (stand-alone pieces of the respective kind) and the respective wall as such that extends continuously. The pieces also form a wall that is heterogeneous, conductive and non-conductive—taken as a whole conductive—and which pieces broaden at least one electrically conductive sidewall.

Preferably, the trench isolation portions can be elongated portions. They have a primary direction of extension and a secondary direction of extension that is shorter than the primary direction of extension. Thus described are preferably such trench isolation portions that are elongate or rectangular in shape. The conductive sidewall portions therebetween are realized geometrically in the same way.

One preference is that the primary direction of extension is in parallel with the trench isolation base wall, e.g. claim 2.

Another preference is that the trench isolation portions are arranged with their primary direction of extension extending in the second lateral direction, e.g. claim 3.

The electrically conductive sidewall portions therebetween are adapted to the geometry of the trench isolation portions. Also here, they are located between the trench isolation portions in the one or other orientation.

Still another preference is the use of trench isolation portions, the orientation of which includes both directions of the afore-mentioned orientations to define are kind of line or heterogeneous wall with isolation portions and electrically conductive sidewall portions. Said portions can be arranged alternately or a plurality of trench isolation portions of the one orientation followed by a plurality of trench isolation portions of the other orientation can be strung together. One electrically conductive sidewall portion each is provided between two subsequent trench isolation portions, e.g. claim 4.

A plurality of electrically conductive sidewalls can be provided, for example, at least one electrically conductive sidewall on the one side and at least one on the other side of the continuously insulating trench isolation base wall, or on both sides of the heterogeneous wall composed of electrically conductive sidewall portions and insulating trench isolation portions.

The two lateral directions are preferably independent of each other, i.e. are perpendicular to each other in the manner of an X-Y coordinate system defining the surface area of the active regions.

The above addressed heterogeneous wall composed of trench isolation portions and electrically conductive sidewall portions can be enclosed by one continuously electrically conductive sidewall each on both sides, e.g. claim 5. Each trench isolation portion is embedded between electrically conductive portions of the electrically conductive sidewall and the electrically conductive sidewall portions (in the direction of extension of the heterogeneous wall). In this way, an extended electrically conductive sidewall structure is formed into which insulating trench isolation portions are embedded.

At least two continuously electrically conductive sidewalls are preferably provided on at least one side of the insulating base wall. Additional or the same walls can be provided on both sides of the continuously insulating base wall.

An enlargement of the perimeter of the trench isolation structure and thus an enlargement of the sidewall is achieved thereby so that more conductive material can be provided on one or both sidewalls.

As opposed to conventional isolation trenches that are substantially composed of straight-line pieces extending in the same direction to isolate corresponding areas of adjacent component regions (active regions with or without components) extending along this same lateral direction, according to the invention, additional portions are inserted that can be connected or not to a continuous base wall that provides for the actual electrical isolation.

For example, by providing individual isolation trench portions that are not connected to the insulating base wall, a large sidewall with the spaced apart insulating portions is obtained as a whole. They do not have any common contact area with the insulating base wall.

Thus, the separate trench isolation portions no longer assume the function of isolation of the adjacent active regions, but are provided especially for the function of providing the volume of the enlarged sidewall and thus provide for increased conductivity. The basic electrical isolation is realized by the continuous base wall.

As explained above, the corresponding trench isolation portions separated from the base wall can have an elongate shape with a primary and a secondary direction of extension, the primary direction of extension of which is oriented in parallel with the first lateral direction or deviates therefrom (e.g. claim 2, or claim 3, or claim 4). The superordinate direction of extension of the trench isolation structure or of the insulating base wall is assumed to be the first of the two lateral directions.

The active component region may be understood as a region that is intended or provided for accommodating at least one semiconductor component, or that already includes the same, e.g. claim 12.

The trench isolation structure can be connected in the direction of depth of a component designed, for example, as an SOI. Here, this may involve both a conductive connection for connecting the vertical conducting or conductive sidewalls or conductive sidewall portions and an insulating connection in which the isolation trench portions are connected in depth in an insulating manner.

The horizontal layers in the depth of the semiconductor device can be provided on one or both sides of the continuous trench isolation base wall and can carry individual potentials.

The trench isolation base wall can have an insulating connection to a buried insulating layer made of a dielectric material.

Even though the trench isolation base wall is continuously insulating, it can extend, in sections, in the first and second lateral directions. Preferably, the directions alternate, and more preferably by a respective angle of 90° in order to obtain a meander structure in the plane of the two lateral directions of extension, e.g. claim 13 or 23.

As an independent idea, a semiconductor device is realized in a further embodiment that also isolates two active regions from each other. The isolation is provided by the trench isolation structure that comprises a trench isolation base wall for the purpose of isolation. It causes a continuous isolation, as viewed from one of the two lateral directions. In addition, at least one electrically conductive sidewall is provided, e.g. claim 15.

In addition to the trench isolation base wall, a plurality of trench isolation portions with associated electrically conductive sidewall portions are formed, wherein the trench isolation portions are a part of the trench isolation base wall, i.e. are connected thereto. In contrast to the above embodiment, they are not spaced therefrom, but end in this trench isolation base wall, or directly protrude therefrom without any distance.

Thus, an isolation is provided between the trench isolation base wall and the trench isolation portions. Nevertheless, an enlargement of the effective wall area, i.e. an increase in volume of the conductive material can be accomplished by the trench isolation portions and their electrically conductive sidewall portions. Preferably, the trench isolation portions extend in the second lateral direction and the trench isolation base wall extends in the first lateral direction.

In an advantageous embodiment, the insulating trench isolation portions are functionally connected to the trench isolation base wall, i.e. the corresponding trench isolation portions, as an insulating material, are connected to the insulating base wall in an insulating manner, or even have become a part thereof.

In other advantageous embodiments, the plurality of trench isolation portions are provided as projections of the insulating base wall, said the projections extending in the second lateral direction, i.e. transverse to the direction of extension of the base wall, in advantageous variants (e.g. claims 17, 18).

At least one continuously electrically conductive sidewall is provided.

In a specific embodiment, the two continuously electrically conductive sidewalls are provided, more preferably one each on both sides of the trench isolation base wall, e.g. claim 16.

The electrically conductive sidewall portions can have alternating directions, i.e. they extend in both lateral directions, preferably alternatingly in at least one length range of the trench isolation base wall that serves the purpose of orientation, e.g. claim 21.

The geometric configuration of the electrically conductive sidewall portions can be finger-like, can form a simplified meander shape over a longer range, or a combination of these two geometries can be formed along the extension of the trench isolation base wall, e.g. claim 20.

In the finger-like configuration and orientation, which is also feasible for the trench isolation portions, adjacent electrically conductive sidewall portions can merge with each other so that a comb-like configuration of insulating and non-insulating portions is created along the global direction of extension of the trench isolation base wall when a plurality of such geometries are provided.

The trench isolation portions can protrude from the trench isolation base wall and the finger-like electrically conductive sidewall portions can protrude from the electrically conductive sidewall.

In still a further independent variant, the first and the second active regions are isolated from each other along the first lateral direction. Both active regions extend in both lateral directions. This embodiment comprises a specific shape of the trench isolation base wall. It extends or runs in both lateral directions, but is continuously insulating. Due to the geometry of the trench isolation base wall, directions extending in the second lateral direction are obtained even without separate trench isolation portions. The at least one electrically conductive sidewall is arranged at or associated with the trench isolation base wall having this geometrical shape so that, due to the second lateral direction, it is provided with portions extending in this direction and not in the first lateral direction alone, e.g. claim 23.

Thus, more wall length can be provided per given unit of length, and when electrically conductive portions are associated with the trench isolation base wall, the volume of the conductive material increases as well (per given unit of length).

By providing the trench isolation base wall that extends, in sections, in the first and second lateral directions, preferably in an alternating manner, a simplified meander shape of the trench isolation base wall is created.

A person skilled in the art may also visualize the arrangement in a top view such that a straight-line portion having a length considerably exceeding the extension of the two regions to be isolated along the first lateral direction "is folded such" that the created length of the folded structure finally corresponds to the length of the extension for obtaining the desired or required isolation. The "folding" can also be performed such in the layout that a "rounded" structure, e.g. a waveform, is obtained wherein the rounding is dependent on the specifications of the technology used in the actual realization in the semiconductor material.

Despite being formed in this simplified meander shape, the trench isolation base wall causes a continuous electrical isolation, and the electrically conductive sidewall associated with its course remains continuously electrically conductive. In this embodiment, separately provided trench isolation portions are not present, i.e. there are no such portions that are connected to the trench isolation base wall nor such portions that are spaced therefrom on the one side or on the other side of the trench isolation base wall.

Due to the geometry of the trench isolation base wall as well as of the first electrically conductive sidewall, the opposite side of the trench isolation base wall can accommodate a further electrically conductive sidewall, e.g. claims 27, 28. Electrically conductive projections can be associated with the second electrically conductive sidewall, said projections protruding therefrom or ending therein and engaging those shapes of the trench isolation base wall that are formed of three subsequent portions of the (continuous) trench isolation base wall, two of which extending in the second lateral direction and one extending in the first lateral direction.

The variants of the projections (e.g. claim 15) or of the "folding" (e.g. claim 23) distribute more conductive sidewall material per length portion of the isolation trench (or of the trench isolation base wall). The provision of more volume is performed directly by broadening the electrically conductive sidewall (e.g. claim 1). Both solutions, volume or greater (longer) wall or wall area per length portion of the trench isolation base wall achieve a lowering of the electrical resistance of the sidewall (of all its portions in total).

In advantageous embodiments, the corresponding trench isolation structures can extend up to or into a buried insulating layer, as is the case in SOI architectures.

The electrically conductive side surfaces and sidewall portions can extend in correspondence with one or more buried conductive layers or regions in order to provide improved conductivity due to the enlarged overall sidewall.

In further aspects of the disclosure, the production of a semiconductor device is performed on the basis of a layout of a trench isolation structure. The layout of the trench isolation structure is provided such that corresponding trench isolation portions are provided in addition to a base wall running in the direction of extension of the trench isolation structure. Thus, the share of the available electrically conductive sidewall of the trench isolation structure is increased so that thereby further functions of the trench isolation structure can be executed with greater efficiency, and a higher degree of flexibility can be achieved in the design of semiconductor devices since, for example, a good electrical connection of component regions and underlying conductive layers can be accomplished without the need for additional low-resistance connection structures. Based on the corresponding layout, a semiconductor device is then fabricated using suitable means, e.g. claim 30.

Further advantageous variants of the method for producing the semiconductor device on the basis of the layout are apparent from the further dependent claims and can also be gathered from the ensuing detailed description of the Figures.

The embodiments of the invention are illustrated by examples and not in a way that transfers or incorporates limitations from the Figures into the patent claims. In the Figures, same reference numerals denote similar elements.

FIG. 1 shows a top view of a conventional device 99 with conventional trench isolation structures 9.

FIG. 2 shows a schematic cross-sectional view of the device 99 with a conventional isolation trench 12 with two conductive sidewalls 14.

Figure 3:
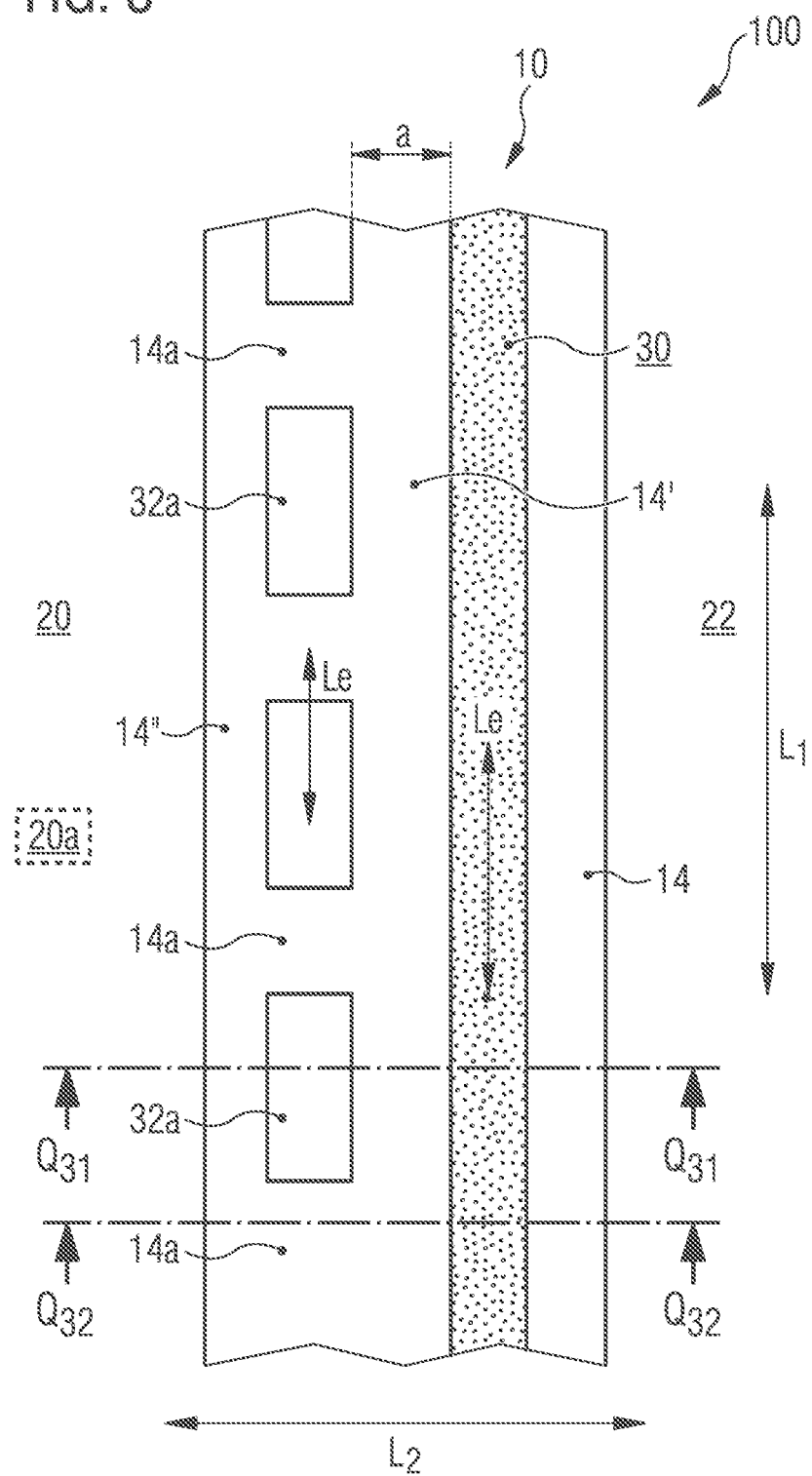

FIG. 3 schematically shows a top view of a new device 100 or a layout of a trench isolation structure 10 in which additional elongate trench isolation portions 32a are provided together with an elongate, continuously insulating base wall 30 to enlarge the sidewall as a whole and thus the achievable volume of the conductive edge of the trench isolation structure 10. FIG. 3a and FIG. 3b are sections along Q31 and Q32.

FIG. 4 schematically shows a top view of another new device or a layout of a trench isolation structure 10', in which elongate trench isolation portions 32b are additionally provided, the respective primary direction of extension $L_e$ of which extends transverse to the direction of extension of the continuously insulating base wall 30. FIG. 4a and FIG. 4b are sections along Q41 and Q42.

FIG. 5 schematically shows a top view or a layout of a semiconductor device 100 with a trench isolation structure 10* in which a "simplified meander-like" shape or geometry of the continuously insulating base wall 30 is shown so that, on the whole, a larger sidewall area is obtained (per length portion).

Figure 6:
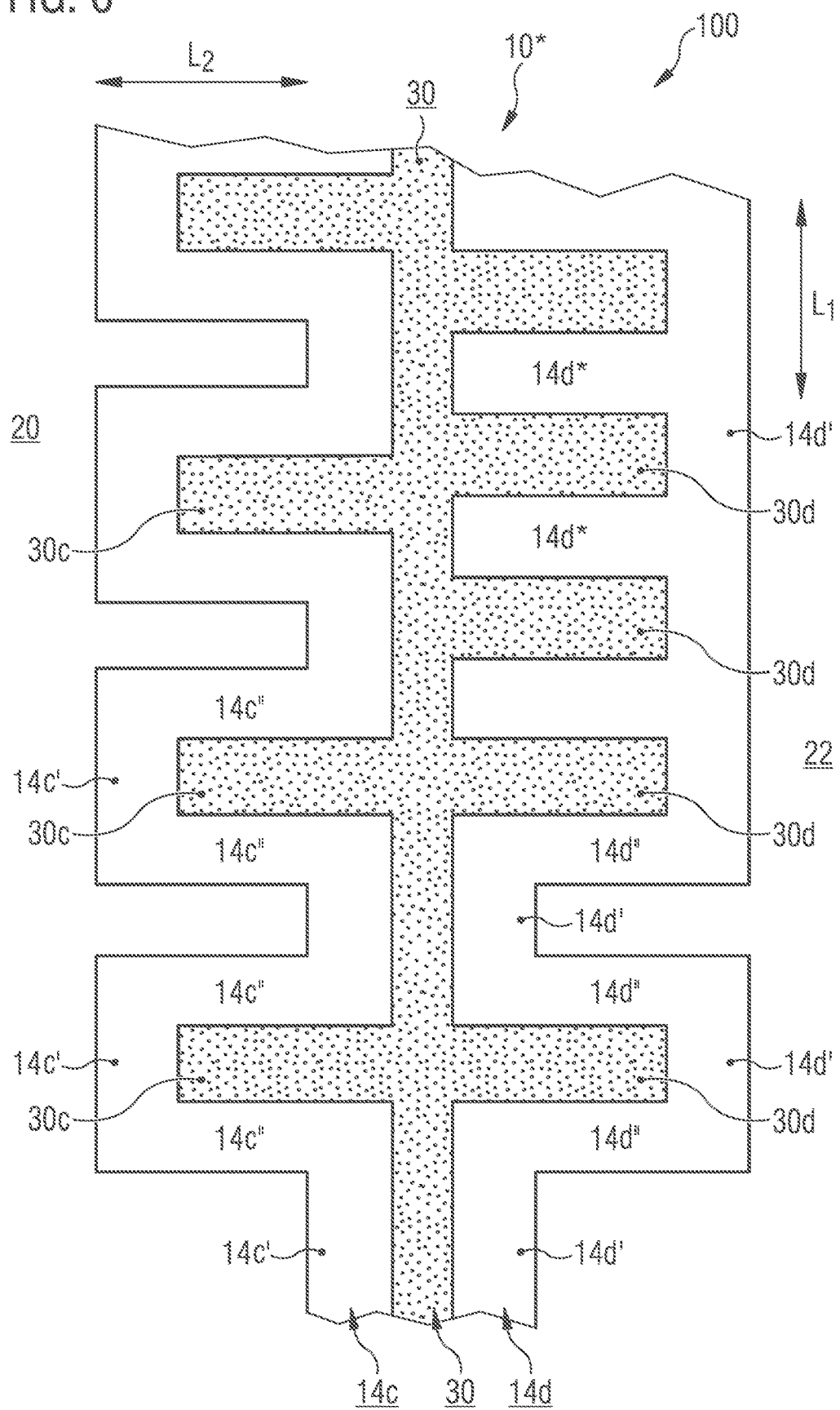

FIG. 6 shows a top view of a further configuration 10* in which insulating trench isolation portions 30c and 30d are arranged at a trench isolation base wall 30 and are represented as insulating projections 30c and 30d of the trench isolation base wall 30. The projections extend in a direction transverse to the direction of extension of the insulating base wall 30.

Further details of the inventions will now be described with reference to the accompanying drawings.

It should be noted that, throughout the Figures, same elements are denoted by same reference numerals, and the same reference numerals as in the embodiments of the invention are also used for elements described with reference to the prior art. A redundant description of corresponding elements has been omitted. Thus, FIGS. 1 and 2 together with the associated description also form part of the disclosure of the examples of the inventions of the residual Figures.

It should be noted that the trench isolation base wall 30 typically changes its direction of extension, for example, in parallel with a second lateral direction $L_2$ when region(s) 20 and/or 22 is/are to be enclosed, as is shown, for example, in the top view of FIG. 1.

FIG. 3 shows a schematic top view or a layout of a first semiconductor device 100 that, in illustrative embodiments, may include components as described, for example, in connection with FIGS. 1 and 2. The semiconductor device comprises e.g. a carrier wafer, e.g. the carrier wafer 2, a buried insulating layer, e.g. the buried layer 4 of FIG. 2, one or more buried doped layers, e.g. layers 6, 6a of FIG. 2, an "active" semiconductor material, e.g. the active material 8, 8b of FIG. 2, when the semiconductor device is to be provided, for example, in the form of an SOI architecture, as also described above.

Furthermore, a first active component region 20 and a second active region 22 are provided in the semiconductor device 100 in such a way that they extend, in sections, along a first lateral direction $L_1$ and are electrically isolated by a trench isolation structure 10 along their extension in the first lateral direction $L_1$.

In the illustrated embodiment, the first component region 20 comprises one or more semiconductor components 20a, e.g. one or more transistors, diodes or other active elements, while the second active region 22 is an active region without semiconductor components. In other cases, the second active region 22 can also comprise one or more active semiconductor elements or components.

The trench isolation structure 10 comprises a trench isolation base wall 30 provided in the form of an insulating material, e.g. in the form of silicon dioxide, silicon nitride and such like, and designed as a continuous, elongate element, the direction of extension $L_e$ of which extends in parallel with the first lateral direction $L_1$. The base wall 30 has two functions: One the one hand, it causes an electrical isolation of the corresponding portions of the active regions 20 and 22 along the first lateral direction $L_1$, on the other hand, it enables an electrical connection to underlying layers, e.g. to layers 6 (as 6a and 6b) of FIG. 2, by providing electrically conductive sidewalls 14, 14'.

It is to be pointed out again that the trench isolation base wall 30 changes its direction of extension, for example, in parallel with the second lateral direction $L_2$ when region(s) 20 and/or 22 is/are to be enclosed, as is shown, for example, in the top view of FIG. 1.

The above as well as the subsequent deliberations apply to a base wall 30 extending in a single direction in each case. That is, when considering a substantially rectangular overall structure, the explanations of this disclosure apply to each "lateral edge" of the rectangle 9 delimited by the trench isolation (from corner to corner in each case).

The trench isolation base wall 30 comprises a correspondingly associated first electrically conductive sidewall 14 on the side of the second component region 22, which sidewall includes a conductive material, e.g. a doped semiconductor material, metal-containing material or such like, in the shown embodiment.

In one embodiment variant, the electrically conductive sidewall 14 on the side of the component region 22 can establish a conductive connection to a buried layer in the component region 22, said connection having the properties of a conventional conductive connection. Then, the corresponding connection to a buried conductive layer is relatively independent of a presence of a low-resistance connection since, for example, functional components are not present in the active region 22. Thus, this area of the conventional structure can definitely be suitable with respect to the insulating wall 30 and the electrically conductive sidewall 14 that is also arranged here.

On the other hand, a conductive connection, for example, to a buried layer 6a can be established, for example, on the side of the component region 20 which, in addition to the "conventional" conductive sidewall 14', results in a higher conductivity due to an increase in conductive material. This is achieved by the provision of the trench isolation portions 32a since conductive sidewall portions 14a associated therewith are created in addition to the continuous conductive sidewall 14' by providing said portions 32a as "insular trench isolation portions" so that, in addition to the conductive sidewall 14' at the trench isolation base wall 30 on one side of the active region 20, the further sidewall pieces 14a, one each between two adjacent insular trench isolation portions, contribute to a considerably enlarged (thickened) overall sidewall and thus to a larger volume of the associated conductive material.

Accordingly, the resistance in the vertical direction downwards into the depth, e.g. towards the conductive buried layer 6a, is reduced.

A further continuous conductive sidewall 14" is provided at the left edge of the image.

Here, three parallel walls are created at the side of the trench isolation base wall 30, two continuous conductive sidewalls 14' and 14" and therebetween a wall that is conductive in sections and composed of the trench isolation portions 32a and the electrically conductive sidewall portions 14a. The direction of extension of this mixed wall is $L_e$.

In the illustrated embodiment, the trench isolation portions 32a are provided as elongate elements, the direction of extension (or orientation) $L_e$ of which extends in parallel with the first lateral direction $L_1$.

Although the trench isolation portions 32a may, in principle, be connected to the base wall 30, as also described in other embodiment variants in the following, the arrangement of the insular portions 32a spaced apart from the base wall 30 is particularly advantageous since in this way the entire functional sidewall 14a, 14' and 14", i.e. also the conductive area facing towards and away from the insulating base wall, is available for accommodation of a conductive material.

The increase in volume of the conductive material of the electrically conductive sidewall is apparent. The electrically conductive sidewall is functionally described by 14 in all embodiments, however, in the example of FIG. 3, one electrically conductive sidewall 14 and 14' each is present on both sides of the insulating base wall 30.

On the other hand, the electrically conductive sidewall 14' is only a portion of the further electrically conductive sidewall portions 14a adjoining this side and of the further sidewall 14". The sidewall portions 14a are located between the trench isolation portions 32a that are spaced from each other and from the base wall 30 at a distance a, and the further electrically conductive sidewall 14" is adjoined thereto and faces away from the insulating base wall 30.

The individual components 14', 14" and 14a functionally form an electrically conductive sidewall having a large volume or, when viewed from the surface area of FIG. 3, having a large wall area (as viewed in the horizontal section).

The two sections of FIGS. 3a and 3b show the two vertical sectional planes $Q_{31}$ and $Q_{32}$ of FIG. 3. The difference between these illustrated sections is the presence of a trench isolation portion 32a in FIG. 3a and the absence of such a portion 32a when the conductive sidewall portion 14a is shown in section. The electrically conductive buried layer 6a (on the left) and the buried conductive layer 6 in the right active region 22 can be seen in both Figures.

The distance a created between the trench isolation base wall 30 and the trench isolation portions 32a in the lateral direction $L_2$ in FIG. 3 is to be mentioned.

FIG. 4 shows a further embodiment variant in which a trench isolation structure 10' comprises the trench isolation base wall 30 that, as in the embodiment of FIG. 3, is suited to enable the electrical isolation between the first active component region 20 and the second active region 22.

The trench isolation portions 32b provided here are arranged in such a way that a high degree of flexibility is achieved when the resulting overall sidewall is enlarged.

In the shown embodiment, the trench isolation portions 32b are provided as elongate, i.e. rectangular, portions. The direction of extension or orientation $L_e$ of the primary extension extends in the second lateral direction $L_2$. In this way, the trench isolation portions 32b can be designed variable in length, while a minimum distance can be maintained along the first lateral direction $L_1$. When a minimum distance is given between the respective adjacent portions 32b, which can typically not be any less due to technological or procedural conditions, an enlargement of the electrically conductive sidewall portions 14b can be achieved by increasing a length in the second lateral direction $L_2$ (as the primary direction of extension) so that a desired thickening of the overall sidewall (in a top view in the illustrated section) and thus the correspondingly increased volume of the overall sidewall is obtained.

As in FIG. 3, three electrically conductive sidewalls are provided in the direction of extension of the trench isolation base wall 30: The electrically conductive sidewalls 14' and 14 on both sides of the base wall 30 and the outer electrically conductive sidewall, which also here is a continuously extending sidewall 14" that faces away (is remote) from the base wall 30. The conductive sidewall portions 14b extend between the electrically conductive sidewalls 14' and 14" and between respective adjacent but spaced apart trench isolation portions 32b which, on their part, maintain a distance b from trench isolation base wall 30.

Also here, as in FIG. 3, two vertical sections $Q_{41}$ and $Q_{42}$ in FIGS. 4a and 4b show the configuration of the trench isolation structure in direction $L_2$. Functionally, the entire area to the left of the insulating base wall 30 is the electrically conductive sidewall which can also be described as being provided with a "wall base area" in the view of FIG. 4 (from the top) even though the wall area of the sidewall would rather be considered as being oriented vertically.

Then, it is the bottom area or a horizontal sectional area of the overall sidewall that is considerably increased by the design of FIG. 4 just as the associated volume is correspondingly increased in the three-dimensional view.

In an embodiment that is not shown separately, the examples of FIGS. 3 and 4 are mixed so that the plurality of trench isolation portions include elongate portions 32a and 32b, the primary direction of extension $L_e$ of which extends along both the first lateral direction $L_1$ and the second lateral direction $L_2$, said the second lateral direction $L_2$ differing from the first lateral direction. This may be varied in groups, or carried out in a continuously alternating manner with respect to each trench isolation portion.

Electrically conductive sidewall portions 14b are associated with the plurality of trench isolation portions 32a, 32b.

One trench isolation portion each is enclosed by two portions of the electrically conductive sidewalls 14', 14" and by two electrically conductive sidewall portions 14a or 14b to form the extended electrically conductive sidewall.

FIG. 5 schematically shows a top view or a layout of the semiconductor device 100 in a further advantageous embodiment in which a trench isolation structure 10" is used. The trench isolation portions are a part of the trench isolation base wall 30, or, viewed differently, the trench isolation portions are omitted and the trench isolation base wall, in sections, changes its directions. The trench isolation base wall 30 still extends continuously, but in varying directions, in particular in sections or in an alternating manner.

One, preferably two electrically conductive sidewalls, e.g. an electrically conductive sidewall 14 that extends in a straight line and a further electrically conductive sidewall 14e that follows the alternating directions of the trench isolation base wall 30 are associated with the trench isolation base wall 30.

In the example, the alternating directions are the two lateral directions $L_1$ and $L_2$. On the left of FIG. 5, a U is formed of portions 30", 30', and 30" of the trench isolation base wall 30 and adjacent thereto a U is formed of electrically conductive sidewall portions 14e"', 14e', and 14e". An inverted U can be adjoined thereto, and a plurality of said geometries may follow in lateral direction $L_1$.

The arrangement shown in FIG. 5 may also be described such that an "originally" straight-line portion 30 is folded accordingly so that this simplified meander-shaped course composed of U elements directed opposite to each other is created.

The structure of the simplified meander or the lengths of portions 30' and 30" can be selected such that, due to the processing for the production of the conductive sidewall regions, corresponding areas 14g of the electrically conductive sidewalls "grow together" so that a more or less straight-line (right) edge with corresponding fingers 14g as electrically conductive sidewall portions is obtained on the side of the second component region 22, while at the same time the simplified meander shape is maintained on the side of the first component region 20.

The second electrically conductive sidewall 14 can comprise electrically conductive projections 14g protruding from the second electrically conductive sidewall and extending in the second lateral direction ($L_2$). They each engage in the U of the simplified meander opening to the right.

In other embodiment variants not shown, portions 30' and portions 30" can be provided at different angles so that, for example, a zig-zag arrangement is created in which a respective first portion and a respective second portion are connected to each other at an acute angle. In still other embodiment variants, portions 30' and 30" can be provided together as radiused or rounded components in such a manner that an almost wavelike configuration of the trench isolation base wall 30 is created with respect to its portions 30' and 30". In each case, a considerably enlarged electrically conductive sidewall is obtained as compared to the conventional arrangement with the two sidewalls 14 as shown in FIG. 1.

FIG. 6 shows a further arrangement of the semiconductor device 100 with a trench isolation structure 10* in which the trench isolation base wall 30 comprises insulating projections 30c and 30d that, in the shown embodiment, are formed as elongate trench isolation portions extending towards both sides and each being connected to the trench isolation base wall 30 in an insulating manner, i.e. adjoined thereto or ending therein.

Two electrically conductive sidewalls 14c and 14d are provided which, in sections, can have alternating directions, as can be seen at the first fingers 30c, 30d from the bottom. Electrically conductive sidewall portions 14c' 14c", 14c', or 14d', 14d", 14d' enclose the first fingers 30c, 30d protruding away from the insulating base wall.

The distance of the respective portions 30d in the first lateral direction $L_1$ can be defined such that, for example, electrically conductive sidewall pieces 14d* are created that are merged or combined. Thus, a corresponding longer straight portion 14d' is created as an electrically conductive sidewall.

When greater distances are selected, electrically conductive sidewall portions are created that retrace the outer course of the respective portions (the protruding fingers) 30c, as shown, for example, on the side of the first component region 20 in a continuous manner. On the right in the active region 22, a comb shape 14d', 14d* is shown that is composed of electrically conductive sidewall portions and trench isolation portions.

These geometries can also follow each other, as shown by trench isolation portion 30d and the electrically conductive sidewall portions 14d''', 14d', 14d" at the bottom on the right. The same holds true for trench isolation portion 30c and the electrically conductive sidewall portions 14c", 14c', 14c" at the bottom on the left.

Obviously, two or more of the above illustrated geometric arrangements can be combined in the layout of the trench isolation structure 10, also to the left and to the right. However, the above shown variants provide a geometric shape in the layout that is easy to realize and can then be efficiently transferred into the semiconductor material when applying known processes.

The fabrication of the above shown semiconductor devices 100 is accomplished by initially creating or providing a suitable layout for the trench isolation structure 10 in which an enlarged electrically conductive sidewall comprising the trench isolation structure is generally enabled.

Corresponding lithography masks can be created on the basis of this layout in order to produce corresponding trenches by known methods. After application of a suitable lithography mask to the semiconductor material, e.g. a silicon-based wafer, said mask substantially reproducing the previously created layout, corresponding trenches are etched into the substrate material, e.g. a silicon material or other suitable semiconductor material, which trenches extend up to a desired depth, for example, up to or into or through a buried insulating layer.

The corresponding sidewalls having the increased perimeter length and thus—depending on the depth—an increased volume that is to maintain a correspondingly reduced conductivity are created by the etching. As explained above, a layer of a suitable material or materials, e.g. an insulating material, having a suitable layer thickness and a high dopant concentration is deposited to this effect in some embodiments so that the previously formed trenches are lined accordingly. Undesirable material of the layer at the bottom of the trench can be removed by anisotropic etching. The material outside of trenches can be removed in the same way.

After deposition of the doped material, a corresponding heat treatment is performed at a suitable point of the overall process using parameters that are in line with the temperature-time budget so that a corresponding depth of penetration of the dopants and a corresponding dopant concentration are obtained.

In contrast to the conventional strategy, an increased amount of conductive material is provided due to the larger overall sidewall for obtaining increased conductivity with otherwise equal process parameters for the diffusion. The same is true if conductivity is obtained by implantation of ions into the exposed trenches. That is, by using suitable implantation parameters in the form of dose and angle that are subject to certain limitations, as explained above, a corresponding doping can be realized, wherein also here an enlarged overall sidewall having an increased volume of the created conductive material again contributes to this purpose.

Due to the larger sidewall and thus the increased volume of conductive material in the respective trench isolation structure 10 (also referred to as: isolation trench structure), a high-quality, in terms of low resistance, connection to buried conductive layers or doped semiconductor layers can thus be established. Due to the new geometry of the trench isolation structure, the additional "consumption of surface area" is negligible or is at least significantly less as compared to the effort that would be required to create a corresponding low-resistance connection of buried layers by connection structures specially adapted for this purpose. Furthermore, no additional process steps are required due to the design of the trench isolation structures as opposed to conventional strategies, as described e.g. in connection with FIG. 2, so that a high degree of compatibility with existing processes is maintained while at the same time a high degree of flexibility for the adjustment of the desired conductivity is accomplished merely by adapting the layout of the trench isolation structure.

The invention claimed is:

1. A method for producing a semiconductor device comprising:
   providing a layout of a trench isolation structure (10, 10') that electrically isolates a first active component region from a second active region (20, 22);
   in addition to an isolation trench base wall (30) extending a direction of extension of the trench isolation structure (10, 10'), enlarging or extending an entire electrically conductive sidewall of the trench isolation structure by providing isolation trench portions (32a; 32b; 30c, 30d) with electrically conductive sidewall portions (14a, 14b, 14c"); and
   producing the semiconductor device by using the layout.

2. The method of claim 1, wherein the isolation trench portions are provided in the layout such that at least some isolation trench portions are spaced from the base wall by conductive sidewall portions or a conductive sidewall (14').

3. The method of claim 1, wherein the isolation trench base wall is provided in the layout as an insulating trench wall that is composed of straight-line pieces and encloses the first component region, and the isolation trench portions are arranged on at least one side of the first active component region (20).

4. The method of claim 1, wherein the isolation trench portions are provided as elongate elements having a primary direction of extension, an orientation of which extends transverse to a direction of extension of the isolation trench base wall (30).

5. The method of claim 1, wherein the isolation trench portions are provided as elongate elements having a primary direction of extension, an orientation of which extends in parallel with a direction of extension of the isolation trench base wall (30).

6. The method of claim 1, wherein the isolation trench portions (30*c*, 30*d*) are provided in the layout in such a manner that at least some isolation trench portions are connected to the isolation trench base wall (30) via an insulating material.

7. The method of claim 1, wherein at least some isolation trench portions are designed as projections (30*c*, 30*d*) of the isolation trench base wall (30) to which the at least some isolation trench portions are connected in an insulating manner.

8. The method of claim 1, wherein the production is performed in such a manner that an entire electrically conductive sidewall with electrically conductive sidewall portions is produced as an electrically conductive volume.

9. The method of claim 1, wherein the production is performed in such a manner that a buried insulating layer (4) beneath the first active component region (20) and/or beneath the second active region (22) contacts a bottom end of an electrically conductive volume.

\* \* \* \* \*